United States Patent
Evans et al.

(10) Patent No.: US 7,450,624 B2
(45) Date of Patent: Nov. 11, 2008

(54) GRATING—OUTCOUPLED SURFACE-EMITTING LASERS

(75) Inventors: Gary A. Evans, Plano, TX (US); Jay B. Kirk, Plano, TX (US); Jacob Meyer Hammer, Annapolis, MD (US)

(73) Assignee: Photodigm, Inc., Richardson, TX (US)

( * ) Notice: Subject to any disclaimer, the term of this patent is extended or adjusted under 35 U.S.C. 154(b) by 434 days.

(21) Appl. No.: 11/269,385

(22) Filed: Nov. 8, 2005

(65) Prior Publication Data

US 2006/0056479 A1   Mar. 16, 2006

Related U.S. Application Data

(63) Continuation of application No. 09/844,484, filed on Apr. 27, 2001, now Pat. No. 6,963,597.

(60) Provisional application No. 60/200,603, filed on Apr. 28, 2000, provisional application No. 60/200,454, filed on Apr. 28, 2000, provisional application No. 60/209,822, filed on Jun. 6, 2000, provisional application No. 60/230,534, filed on Sep. 1, 2000, provisional application No. 60/235,090, filed on Sep. 25, 2000.

(51) Int. Cl.
*H01S 5/00* (2006.01)

(52) U.S. Cl. ............ 372/50.11; 372/64; 372/103; 372/108

(58) Field of Classification Search ............ 372/50.11, 372/64
See application file for complete search history.

(56) References Cited

U.S. PATENT DOCUMENTS

| | | | |
|---|---|---|---|
| 4,006,432 A | 2/1977 | Streifer et al. |
| 4,443,890 A | 4/1984 | Eumurian |
| 4,573,157 A | 2/1986 | O'Meara |
| 4,743,083 A | 5/1988 | Schimpe |
| 4,743,087 A | 5/1988 | Utaka et al. |
| 4,829,535 A | 5/1989 | Utaka |
| 4,896,325 A | 1/1990 | Coldren |
| 4,919,507 A | 4/1990 | Evans et al. |
| 4,958,357 A | 9/1990 | Kinoshita |
| 5,088,097 A | 2/1992 | Ono et al. |
| 5,153,935 A | 10/1992 | Mueller |
| 5,200,939 A | 4/1993 | Nishiwaki et al. |
| 5,363,226 A | 11/1994 | Strasser et al. |
| 5,448,581 A | 9/1995 | Wu et al. |
| 5,491,710 A | 2/1996 | Lo |
| 5,515,354 A | 5/1996 | Miyake et al. |

(Continued)

OTHER PUBLICATIONS

"Surface Emitting Semiconductor Lasers and Arrays", Ed. Evans and Hammer, Academic Press, 1993, pp. 1-60.

(Continued)

*Primary Examiner*—Dung T Nguyen
(74) *Attorney, Agent, or Firm*—Duke W. Yee; Theodore D. Fay, III

(57) ABSTRACT

Laser diodes are formed with an outcoupling grating between two separate distributed Bragg reflectors. The devices have gain regions located between the reflector gratings for pumping the active region. The outcoupling grating couples light out of the waveguide normal to the surface if the grating spacings are equal to an integer number of wavelengths of the light within the cavity. If the gratings are not such an integer number, the light is coupled out of the cavity off the normal.

20 Claims, 22 Drawing Sheets

U.S. PATENT DOCUMENTS

| | | | |
|---|---|---|---|
| 5,602,863 | A | 2/1997 | Itagaki |
| 5,617,436 | A | 4/1997 | Lo |
| 5,652,812 | A * | 7/1997 | Gurib et al. .............. 385/14 |
| 5,673,284 | A | 9/1997 | Congdon et al. |
| 5,828,688 | A | 10/1998 | Cook et al. |
| 5,917,798 | A | 6/1999 | Horimai et al. |
| 5,926,494 | A | 7/1999 | Pepper |
| 5,970,081 | A | 10/1999 | Hirayama et al. |
| 6,064,783 | A | 5/2000 | Congdon et al. |
| 6,459,715 | B1 | 10/2002 | Khalfin et al. |
| 7,058,096 | B2 * | 6/2006 | Sarlet et al. .............. 372/20 |

OTHER PUBLICATIONS

Miller et al., "Research Toward Optical Fiber Transmission Systems - Part I: The Transmission Medium", IEEE, vol. 61, No. 12, Dec. 1973, pp. 1703-1751.

Hammer et al., "Optimized Couplers Between Junction Lasers and Single-Mode Fibers", RCA Laboratories, Princeton, NJ, Final Report, Aug. 31, 1981 - Jan. 31, 1983, pp. 1-40.

Hammer et al., "Observations and Theory of High Power Butt Coupling to LiNbO3-Type Waveguides", IEEE Journal of Quantrum Electronics, vol. QE-18, No. 10, Oct. 1982, pp. 1751-1758.

Burns et al., "Laser Diode End-Fire Coupling into Ti:LiNbO3 Waveguides", Applied Optics, vol. 18, No. 15, Aug. 1979, pp. 2536-2537.

Bedford et al., "Bow-Tie Surface-Emitting Lasers", IEEE Photonics Technology Letters, vol. 12, No. 8, Aug. 2000, pp. 948-950.

Schrenk et al., "Surface-Emitting Distributed Feedback Quantum-Cascade Lasers", Applied Physics Letters, vol. 77, No. 14, Oct. 2, 2000, pp. 2086-2088.

Noll et al., "Analysis of Grating Surface Emitting Lasers", IEEE Journal of Quantum Electronics, vol. 26, No. 3, Mar. 1990, pp. 456-466.

Tiberio et al., "Facetless Bragg Reflector Surface-Emitting AIGaAs/GaAs Lasers Fabricated by Electron-Beam Lithography and Chemically Assisted Ion-Beam Etching", J. Vac. Sci. Technol. B9 (6), Nov./Dec. 1991, pp. 2843-2845.

Stoll et al., "Distributed Bragg Deflector: A Multifunctional Integrated Optical Device", Applied Optics, vol. 17, No. 16, Aug. 15, 1978, pp. 2562-2569.

Evans et al., "Progress Toward a Monolithically Integrated Cogerent Diode Laser Array", The Aerospace Corp., El Segundo, CA 90245, Interim Report, Feb. 20, 1981, pp. 1-204.

* cited by examiner

Figure 12 (Modif. 1.?)

ately controlled by the vertical (i.e., normal to the surface) (x) and lateral (y) size and the composition of the guiding structure. Such output beams are typically have too great a divergence for effective coupling to optical fibers, or for other applications requiring beams with low divergence angles.

GRATING—OUTCOUPLED SURFACE-EMITTING LASERS

CROSS-REFERENCE TO OTHER APPLICATION

This application is a continuation of application Ser. No. 09/844,484, filed Apr. 27, 2001, now U.S. Pat. No. 6,963,597.

This application claims priority from 60/200,603 Filed Apr. 28, 2000; 60/200,454 Filed Apr. 28, 2000; 60/209,822 Filed Jun. 6, 2000; 60/230,534 Filed Sep. 1, 2000; and 60/235,090 Filed Sep. 25, 2000, which is hereby incorporated by reference.

BACKGROUND AND SUMMARY OF THE INVENTION

The present application relates to laser diodes, and more particularly to extracting light from a waveguide and coupling that light to a fiber or other device.

BACKGROUND

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams are typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

The optical and electronic properties of a semiconductor depend on the crystal structure of the device, which has led to investigative work into fabricating artificial structures or superlattices. By tailoring the crystal structure of a device during its fabrication, the optical and electronic properties can be controlled. The crystal structures of such devices may be controlled, for instance, by molecular beam epitaxy (MBE) and metal-organic chemical vapor deposition (MOCVD). Such techniques are capable of monolayer control (~5 angstrom) over the chemical composition of a crystal.

Other commonly used heterostructures are quantum wells, in which a single layer of one semiconductor is sandwiched between two layers of a larger bandgap material. Strain is produced by using an epitaxial layer with a different lattice constant than the substrate. This strain has a dramatic effect on the properties of the optical system. Among other things, it can allow bandgap tunability, reduced threshold current, and improved laser reliability.

Strain can also allow laser emission to have tailored polarization. By using appropriate strain, one can produce light predominantly polarized as TE, or TM.

Grating-Outcoupled Surface-Emitting Lasers

This application discloses a laser source. In a preferred embodiment, the source is a laser diode and has an active region with distributed Bragg reflectors at either end to reflect light within the cavity, and an outcoupling grating in the center of the device which couples light out of the cavity. On either side of the outcoupling grating is a gain region with electrical contacts for supplying current.

The outcoupling grating positioned between the reflectors allows the light to be coupled out with less loss than other laser diodes. The light that is not outcoupled stays within the cavity. This design has the advantage that the outcoupler size can be limited to much shorter lengths than other designs, on the order of about 10 microns in the preferred embodiment. In laser diodes where the outcoupler is outside the cavity, it is very difficult to couple out 100% of the light in so short a distance. Light that is not coupled out decreases device efficiency. The surface emitting outcoupling laser diode can also control the outcoupled beam shape by varying the shape of the outcoupling grating.

Our approach avoids the problems cited in OCG devices because it shows innovative grating emitter structures located within the laser cavity and independent of the type of reflectors. these allow efficient laser operation. We teach how to shape the area and vary the properties of the grating emitters to produce desired output beams and he;p stabilize the laser mode to enhance spatial and temporal coherence. We also show that embodiments that produce several wavelengths for efficient coupling and multiplexing to broad band optical fibers. our structures also allow integration with many devices including broad band modulators, switches, and isolators.

This design makes it easier to limit the length of the outcoupling grating to short lengths, on the order of about 10 microns. In designs where the outcoupler is outside the DBR laser region, it becomes very difficult to outcouple 100% of the light in such a short distance. The light that is not coupled out is wasted and decreases device efficiency.

The disclosed innovations, in various embodiments, provide one or more of at least the following advantages:
   low cost;
   device testing at the wafer level;
   emission at all wavelengths from 0.6-2.0 microns with existing and common material systems, with greater ranges possible;
   emission is easily extended to any wavelength as new material systems mature and/or are developed;
   low drive currents;
   higher power capability than existing VCSELs;
   high efficiency;
   direct replacement for VCSELs;
   easily coupled to multi-mode and single-mode fibers.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 7b shows a close up of the crossed gratings for the laser system of FIG. 7a.

DETAILED DESCRIPTION OF THE PREFERRED EMBODIMENTS

Figure 1A:
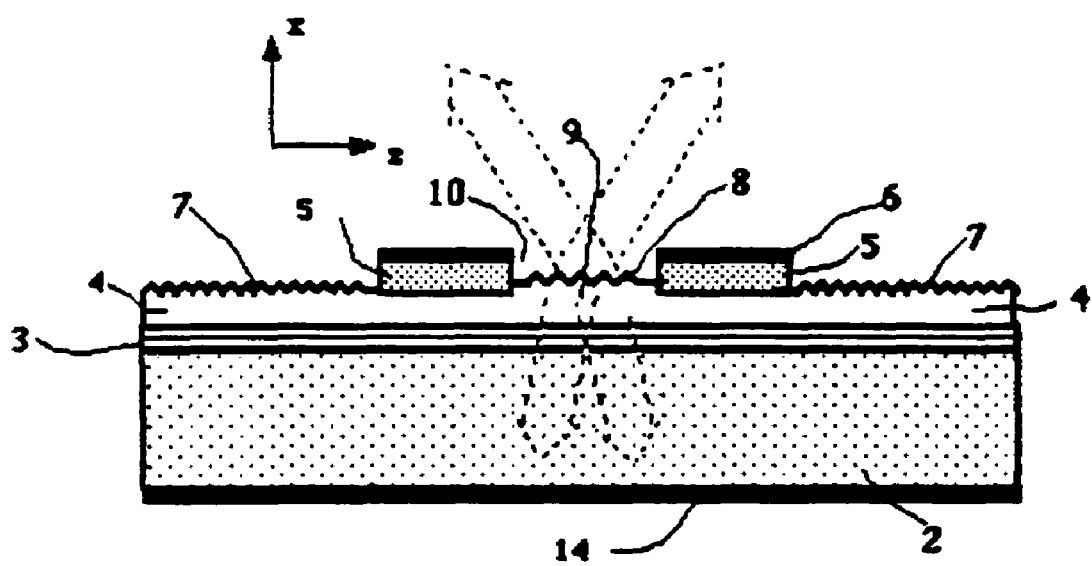
FIG. 1a shows side view of an innovative DBR laser.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feed back varies like a Gaussian. This is accomplished by forming the grating so that its strength varies as $$1-\exp[-(y/\omega)^2]$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. the degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
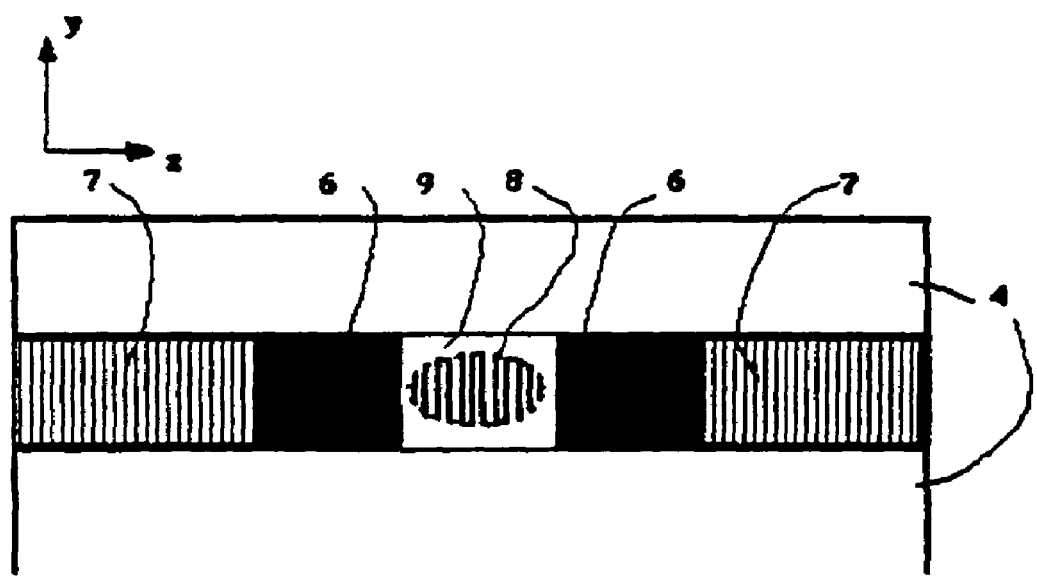
FIG. 1b shows a top view of an innovative DBR laser.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed out-coupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 7a for example. The shape and strength of the two gratings are chosen to produce desirable properties in the out-coupled light. Their periods are individually chosen to suit the desired application, such as to control outcoupling angle, or to couple out different wavelengths.

Figure 2A:
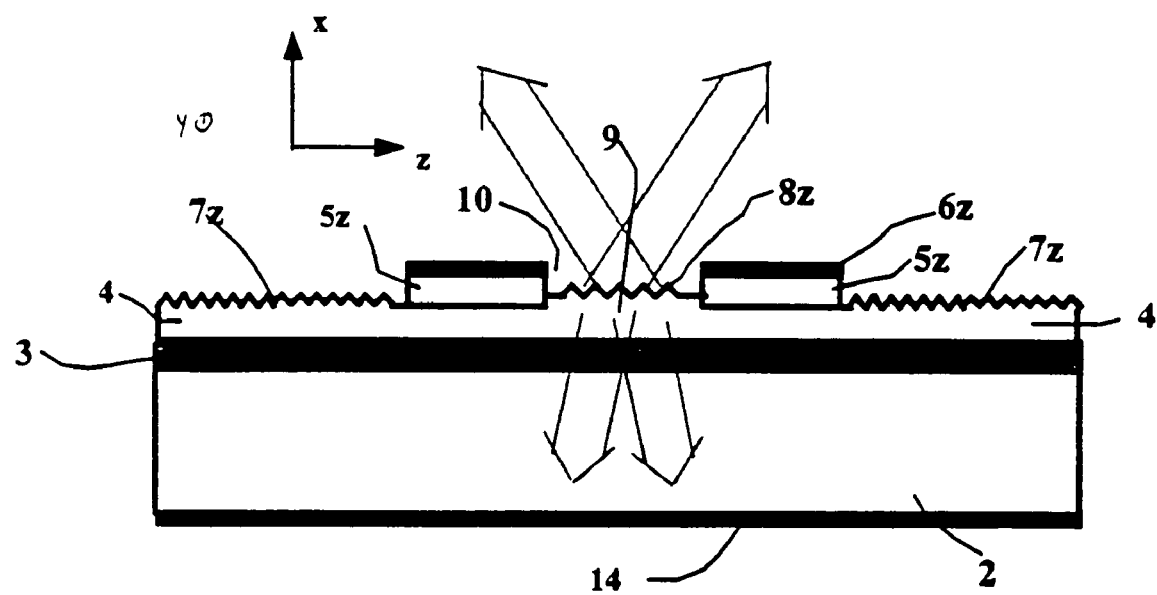
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
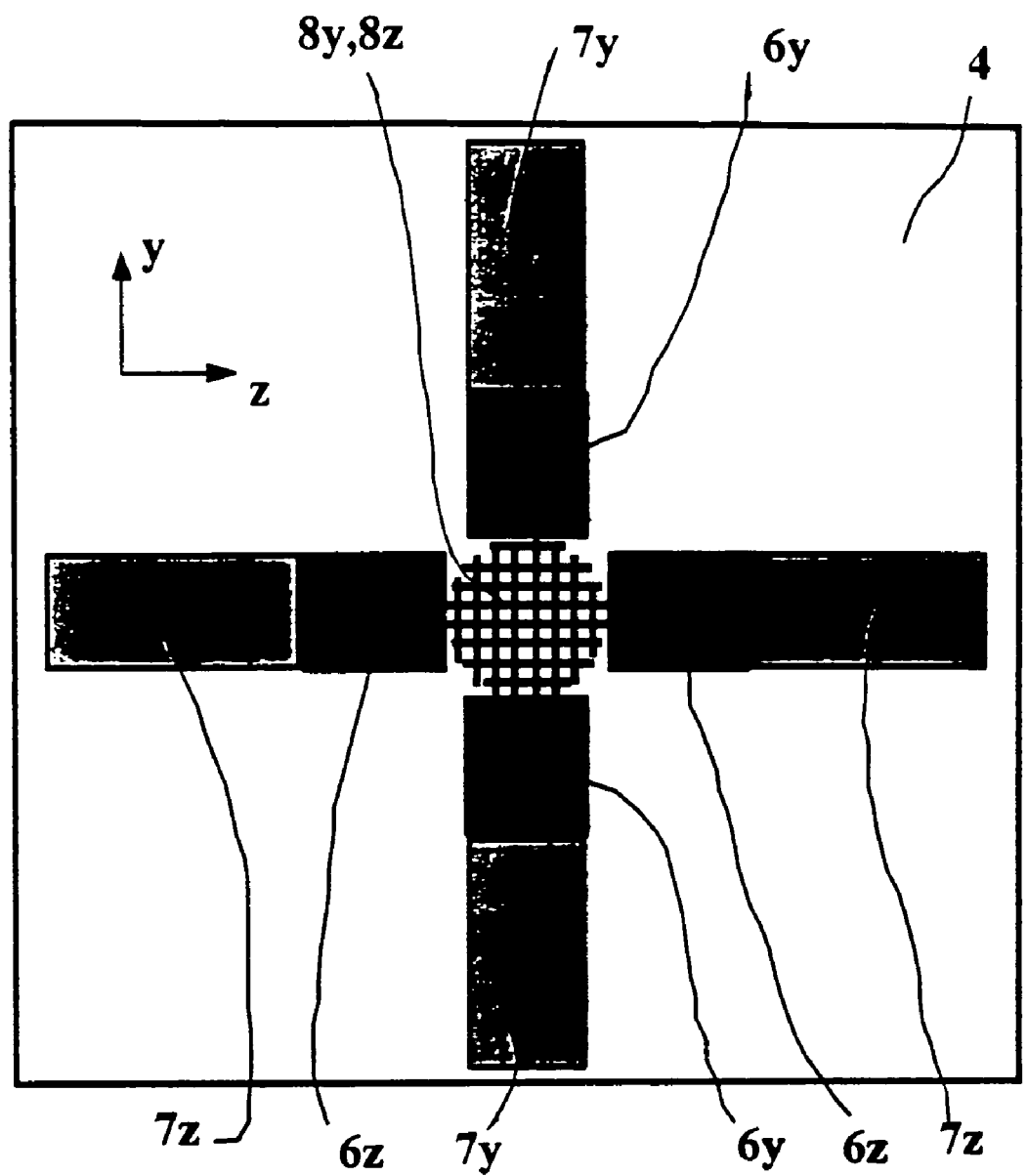
FIG. 2b shows a top view of crossed DBR lasers.

Referring to FIG. 2b, a top view, two crossed DBR lasers are at 90 degrees to one another. Each laser has its own set of reflector gratings 7y, 7z at either end, and both lasers have their own outcoupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same fore each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the outcoupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of out-coupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the crossed outcoupling gratings each polarize the light which they outcouple. In the case of two crossed gratings at 90 degrees, the two beams of light will be polarized at 90 degrees with respect to one another. Coupling light into a fiber with two orthogonal polarizations is required for pumping Raman amplifiers.

Figure 2C:
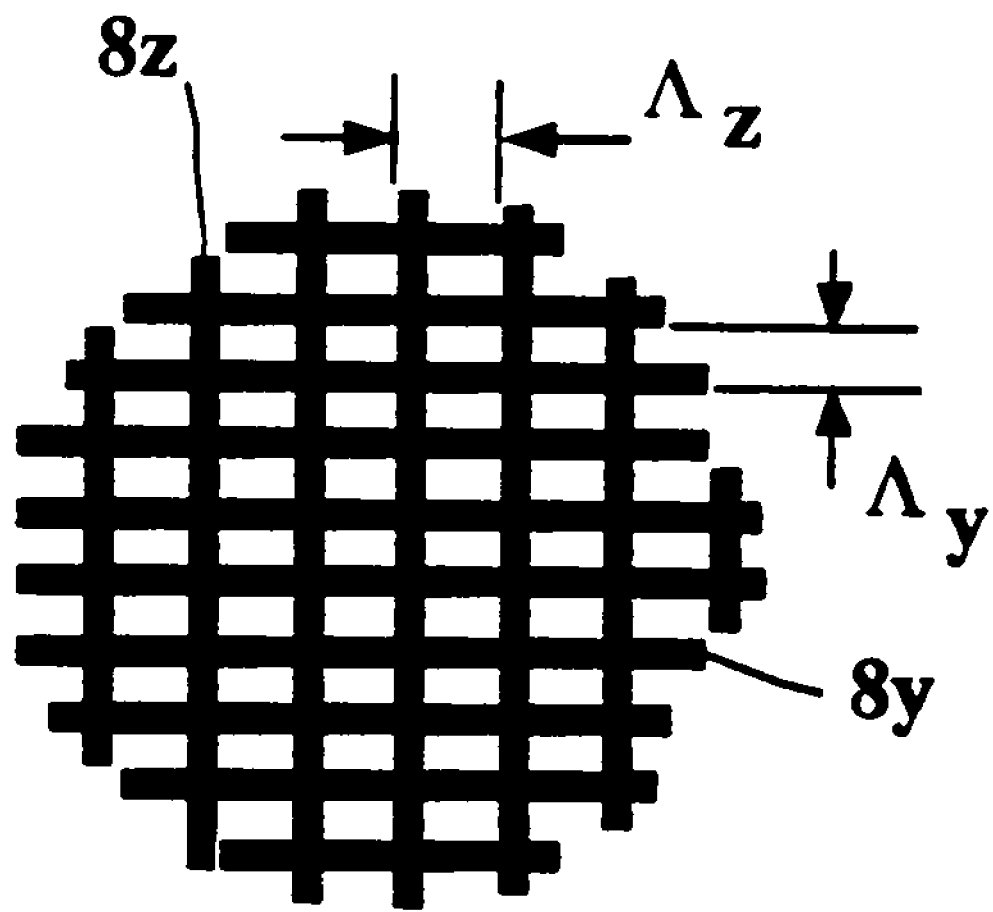
FIG. 2c shows a close up of crossed outcoupling gratings.

FIG. 2c shows a close up of the outcoupling gratings of FIGS. 2a and 2b. The periods, Ly and Lz, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the out-coupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant cross-talk and other interactions between the two lasers. Thus, the disclosed approach can choose the nature of the output beams to be either a combined single frequency coherent source, or two output beams with two independent wavelengths, or two beams with independent wavelengths but with a controlled amount of crosstalk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber. Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, some of the light is reflected and continues to oscillate within the cavity. This has the effect of marginally decreasing the required current for lasing. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
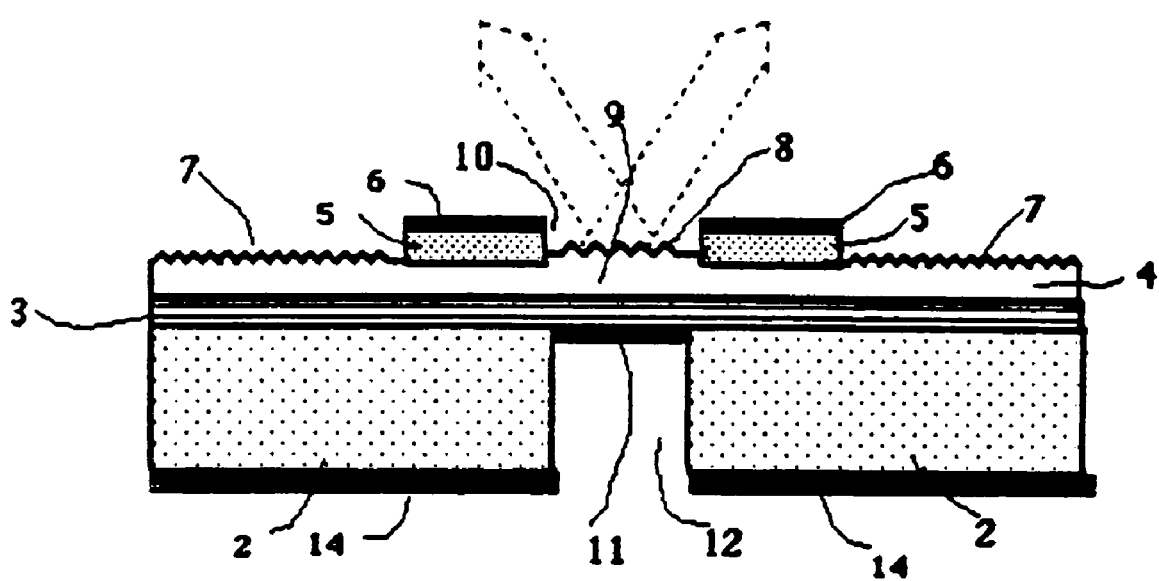
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
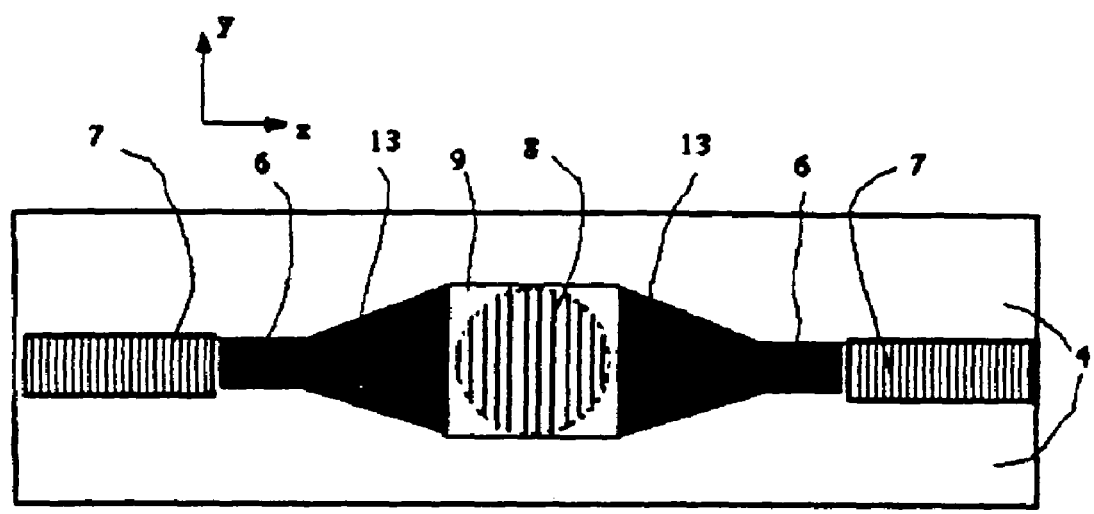
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
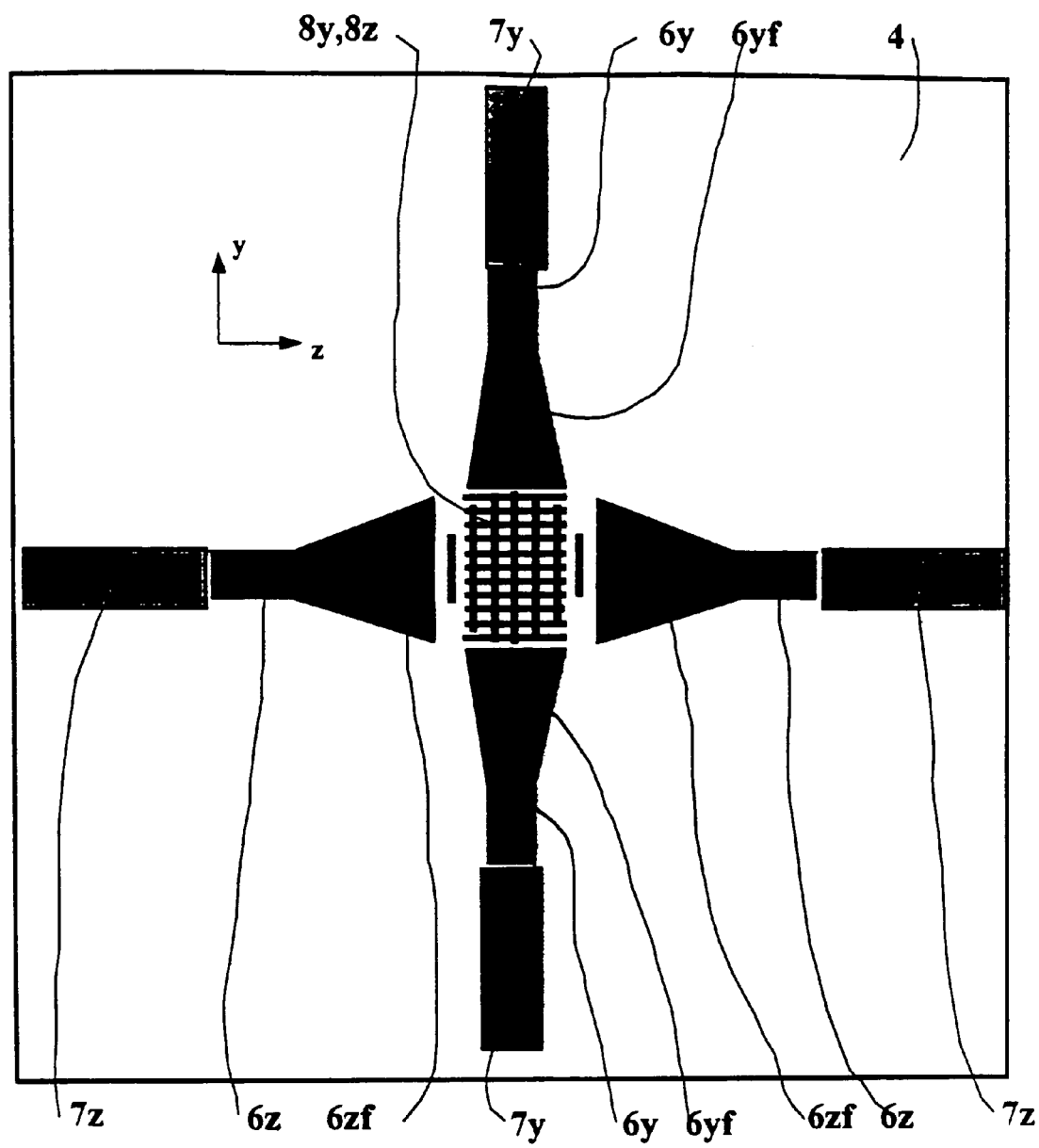
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings 7y, 7z, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
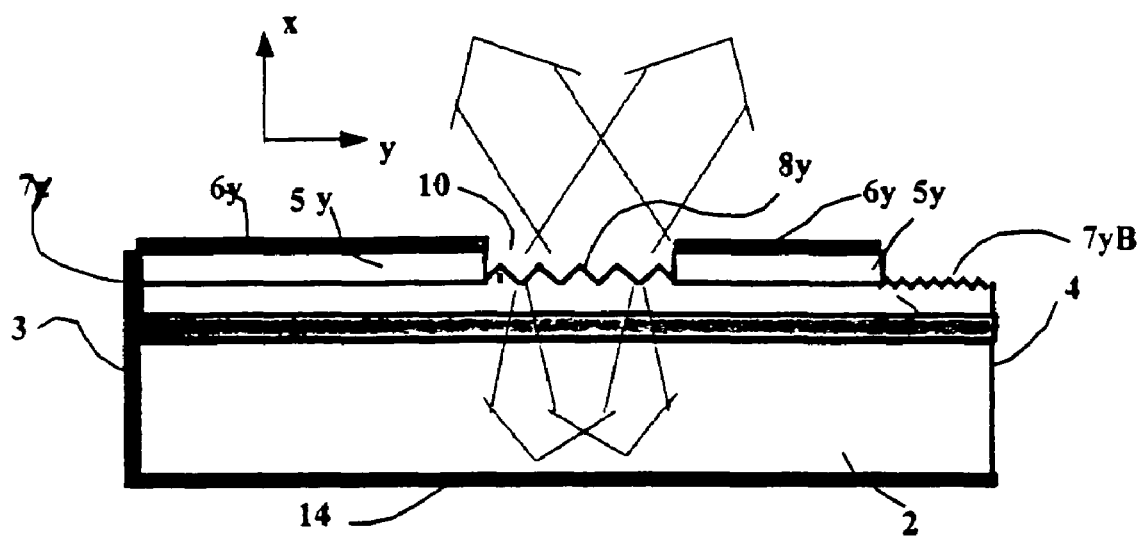
FIG. 5a shows a side view of a laser diode having a DBR at one end and a cleaved facet at the other end.

Another embodiment is shown in FIG. 5a. At one end of the laser, the DBR has been replaced by a reflective end facet 7y. There are still two gain region portions, separated by the OC grating in this embodiment. The other end of the laser has a DBR 7yB, the period of which determines the wavelength that will be stable in the cavity.

Figure 5B:
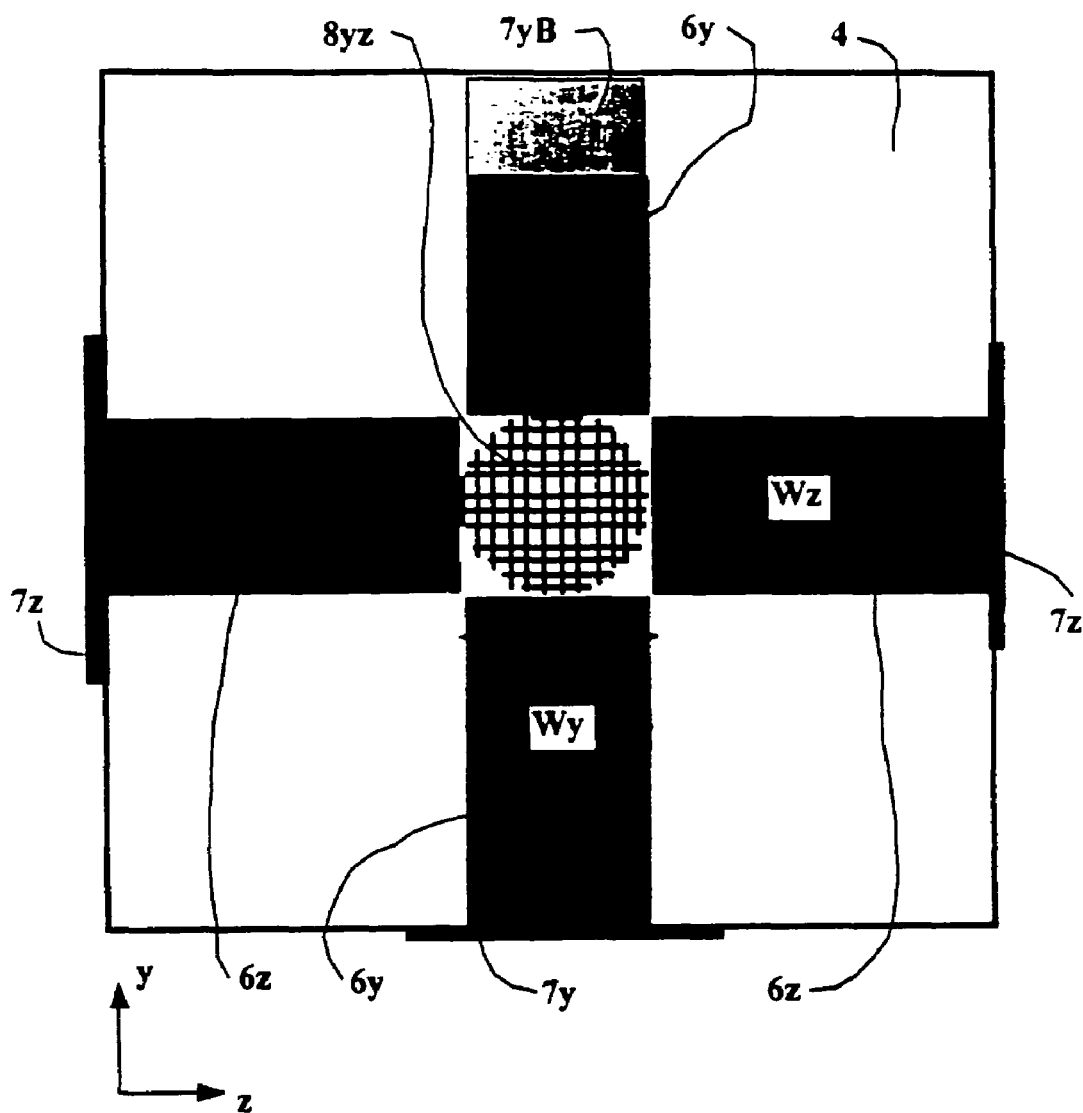
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
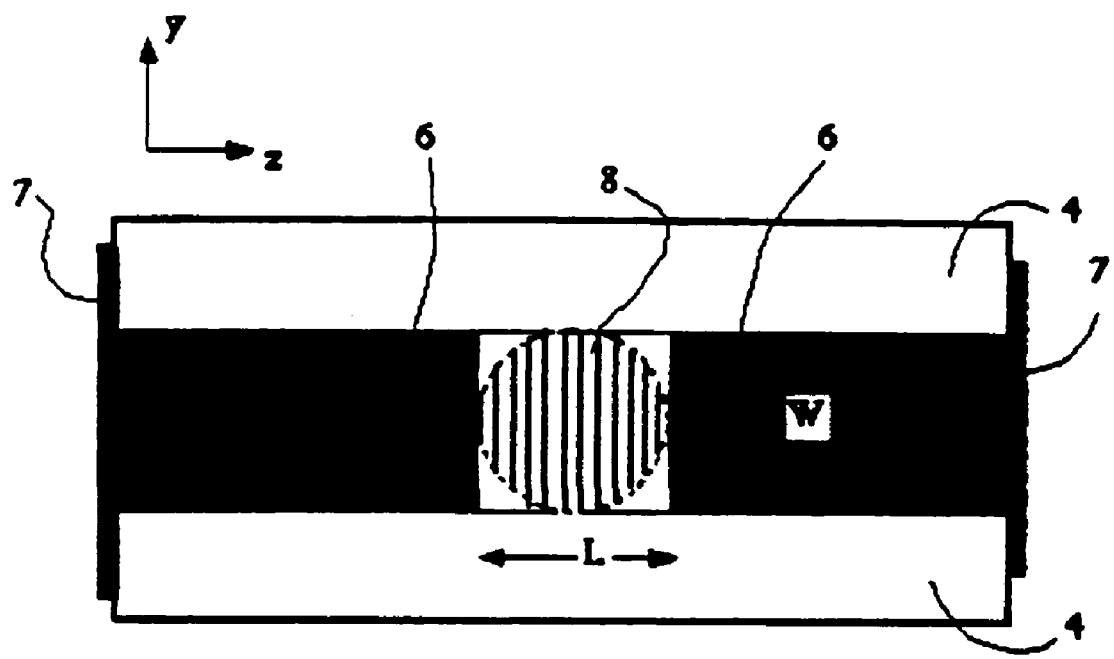
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
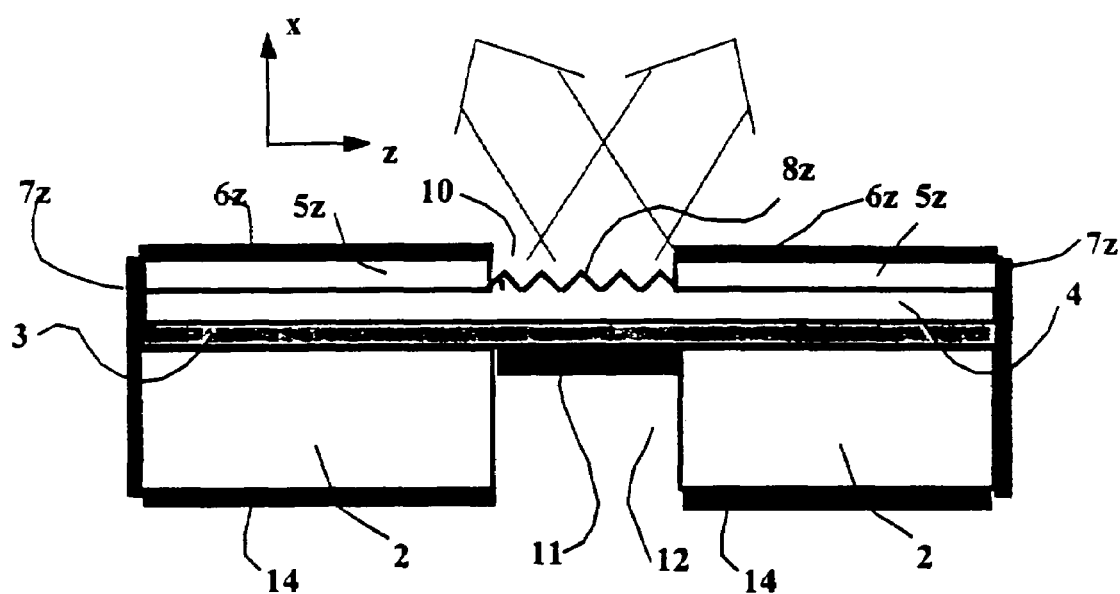
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7A:
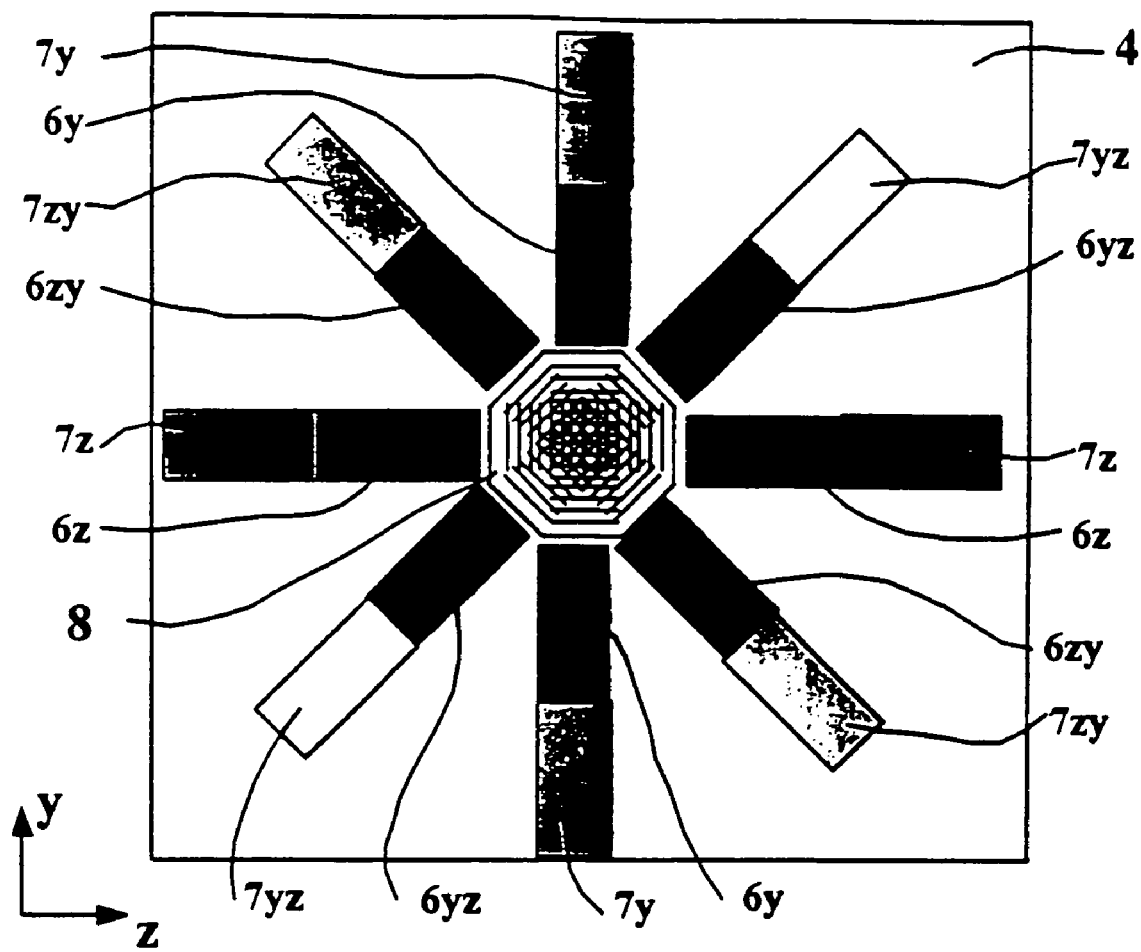
FIG. 7a shows a top view of four crossed DBR lasers each outcoupling light from the same outcoupling element.
Figure 7B:
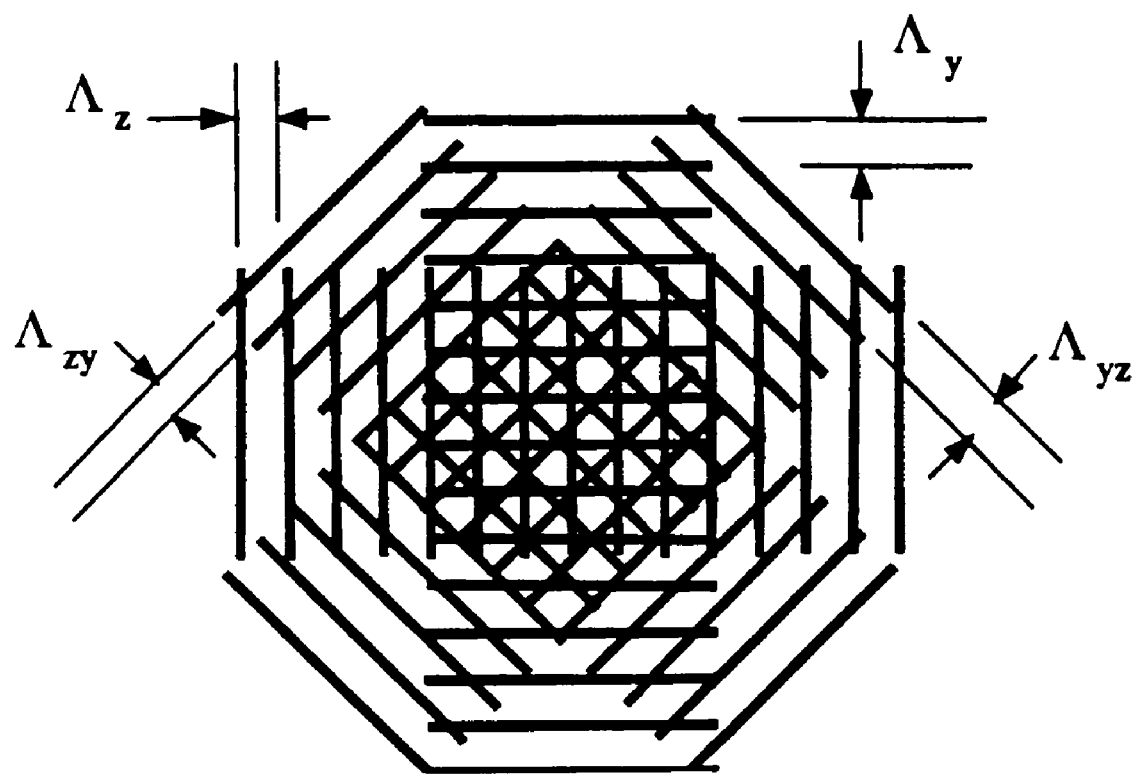

FIG. 7a shows a GO laser system with four crossed lasers being outcoupled at the same spatial location. Distributed Bragg reflectors are shown in this example at each end of the individual lasers. Each laser has its own OC grating superimposed on the other OC gratings to create one virtual grating. (Note that it is possible to overlap the gratings in different planes, having either curved waveguides or making each laser totally in a different plane than the others, but this is a less preferred embodiment. HOEs can be used in place of multiple gratings in such a situation.) FIG. 7b shows a close-up of the outcoupling gratings for the four laser system. There are four gratings, each at a 45 degree angle to the adjacent gratings. The periods of these gratings need not be the same, which allows the use of multiple wavelengths being outcoupled at the same location (assuming the lasers themselves are fashioned to output different wavelengths). The periods of the various gratings are labeled as Lz, Ly, Lzy, and Lyz.

The structure of the grating outcoupled laser allows for the high-level integration of electronic circuitry with the laser device. Many different possible devices can be integrated with the GO laser of the present application, including control electronics and photonic integrated circuits that can be placed on the chip with the laser; electronic integration includes higher level data management electronics such as serialization/deserialization, clock generation and recovery, op amps and analog-to-digital and digital-to-analog converters. The GO laser geometry is also advantageous in that it allows for integration with optical waveguides and integration of light routing circuitry on the chip. Such photonic integration allows optical interconnects between circuit elements, integration of optical isolators, wavelength tunable sections, optical modulators, waveguide couplers, waveguide switches, and simultaneous integration of multiple ones of these components.

Figure 8:
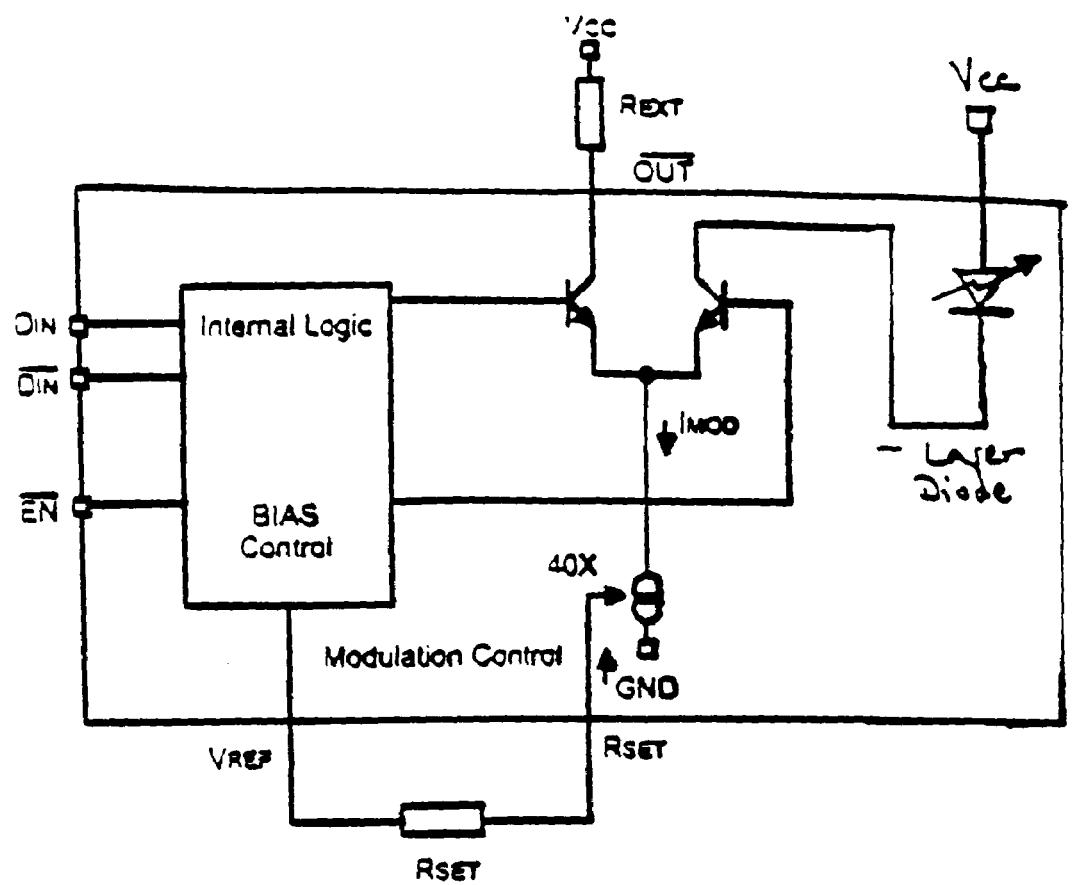
FIG. 8 shows a circuit diagram of integrated elements with the presently disclosed laser system.

FIG. 8 shows an example of a higher level circuit integration on the same chip as the grating outcoupled laser diode. In this example, laser driver and control electronics are integrated. Din and Din-bar are differential data inputs and EN is the chip enable. Internal logic and BIAS control is used to center the data to the inputs of the driver pair and to provide a Vref output. This output is used with Rset to control the current source or modulation current Imod which sets the output current to the grating outcoupled laser diode. The resistor Rext is external to minimize the power dissipation capacity, both Rext and Rset may be integrated as well.

Figure 9:
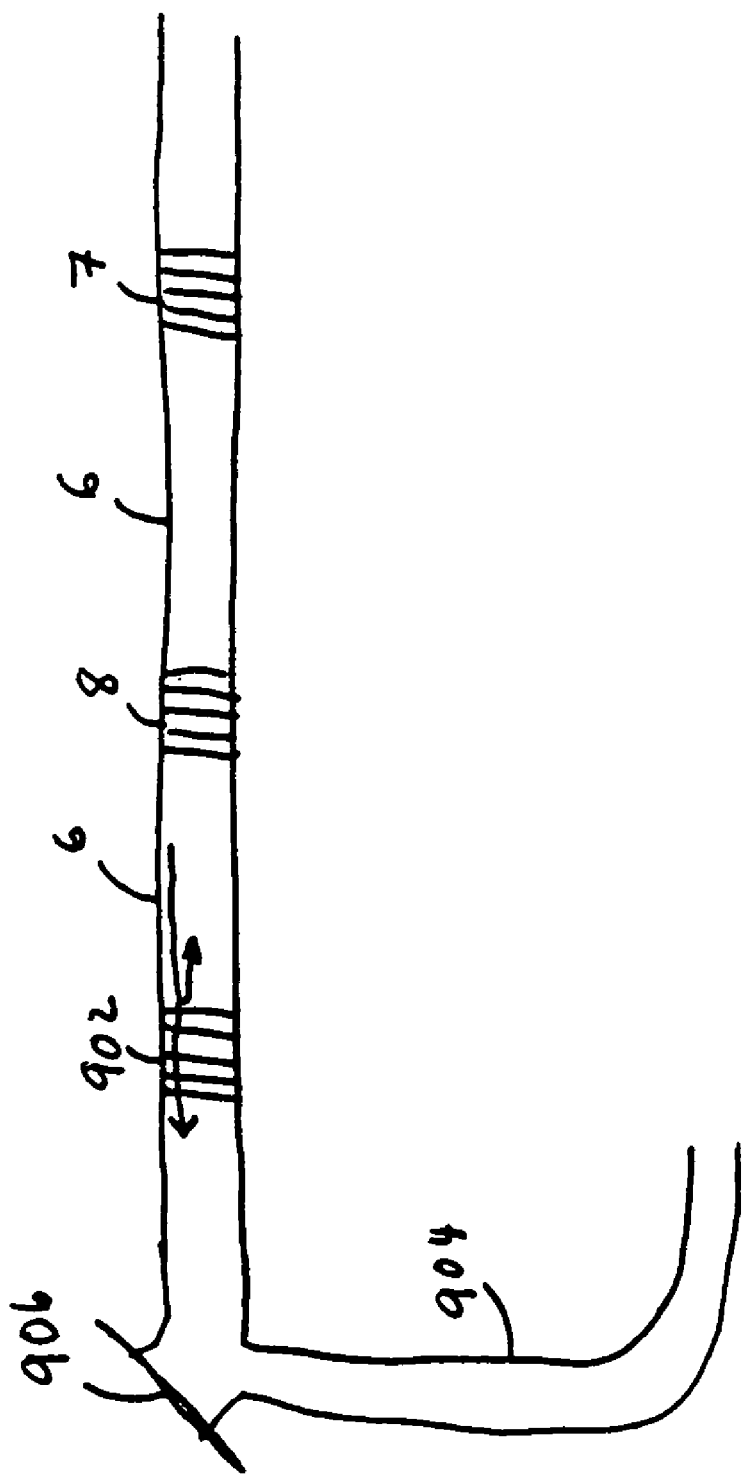
FIG. 9 shows optical waveguides routing light from the laser to other elements.

FIG. 9 shows the optical waveguide technology routing the light from the laser source to another integrated circuit component, for example. One end of the laser has a partially transmitting reflector 902 which allows some of the light to pass through. This light is guided by a waveguide 904 to another circuit element as desired for any given application. In the example shown, a corner turning mirror 906 is used to guide the light.

Figure 10:
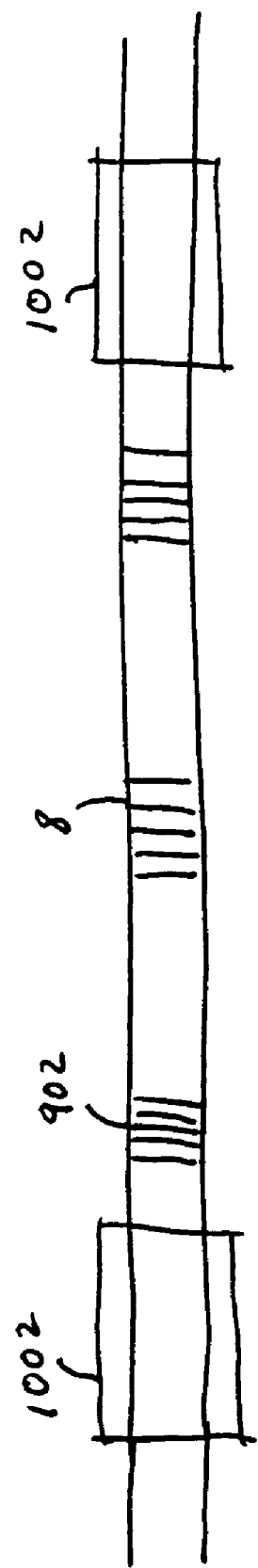
FIG. 10 shows a possible configuration for integrated elements with a laser diode.

Other devices can also be integrated on the same chip with the innovative laser system of the present application. FIG. 10 shows a grating outcoupled laser diode with the OCG 8 between the two reflectors 902 at either end of the cavity. One or both reflectors are partially transmitting gratings in this example. In this variation, a waveguide coupler, which may be used for connecting to other integrated devices, is located outside the laser cavity. A location for such an integrated device 1002 is shown at either end of the cavity. Of course, other devices could also be integrated, for example, modulators or tuning sections.

Figure 11:
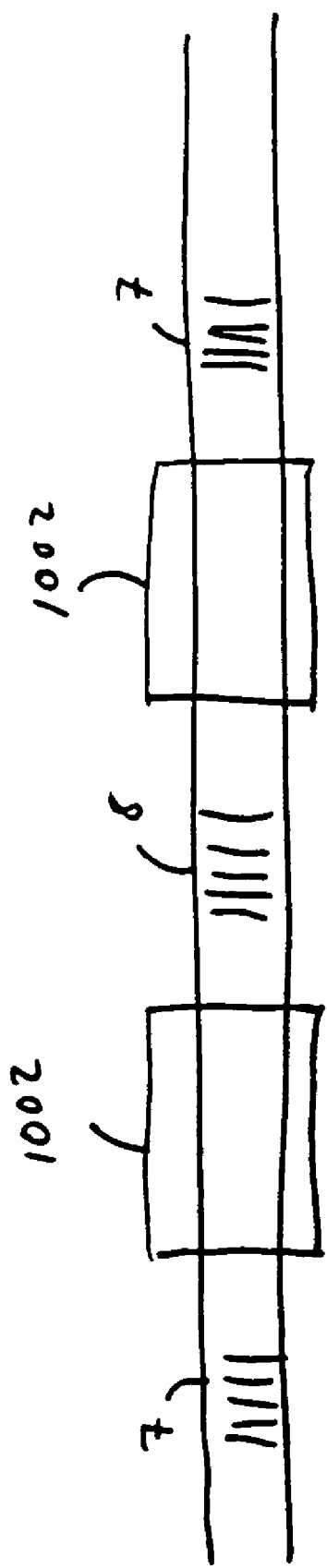
FIG. 11 shows another possible configuration for integrating added elements to the present innovations.

FIG. 11 shows another possible variation for integrating added components (such as a phase adjustor, for example). In this example, two regions 1002 where added devices may be fabricated on chip are shown. In this example, the added components are located within the length of the laser, possibly requiring the gain region contacts to be moved or altered to accommodate the added device.

Figure 12:
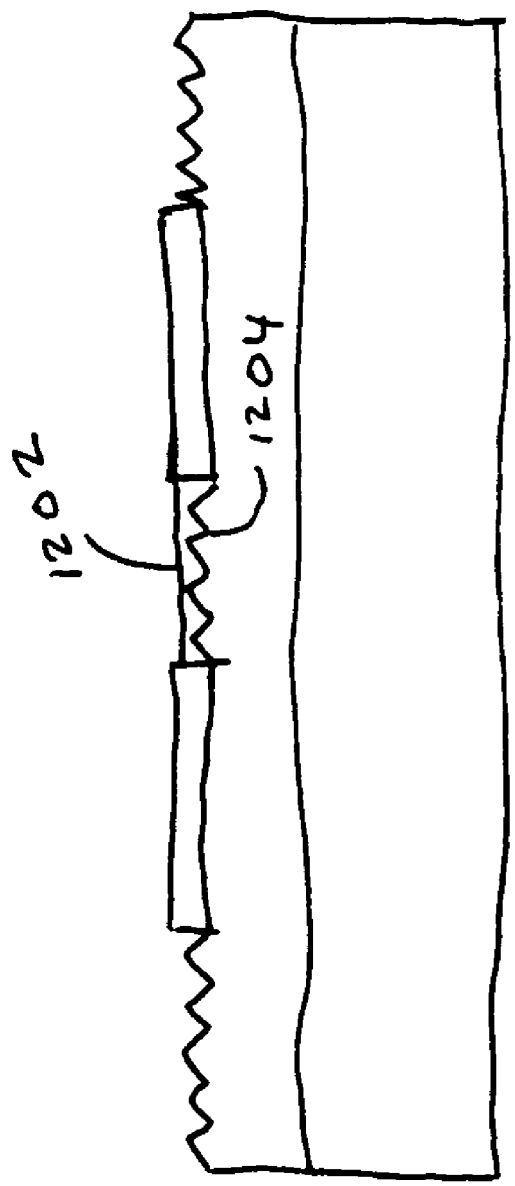
FIG. 12 shows another embodiment of the present application.

FIG. 12 shows another embodiment of the present innovations. In this variation, a reflective coating 1202 (for example, a dielectric stack or a metal layer) is placed on top of the device, where the outcoupling grating 1204 is located. This reflective coating causes the light to be coupled through the bottom of the device. (Note that it is often useful to allow some light to escape the top of the device in this design, as this light can be used to allow easier wafer level probe testing of the device.) If an outcoupling grating is used without such a reflective coating, there is of course light emitted both above and below the waveguide due to reflection from the grating. The reflective coating causes the top emitted lobe of light to instead be emitted through the bottom of the device, so that substantially all light emitted from the cavity is coupled out through the substrate material, which is a transparent material, usually about 100 microns thick. The reflective coating can be metallic (such as gold) or it can be a dielectric stack for better reflection. Generally, if the light is to be emitted out the bottom of the device, a high reflect (HR) coating is placed on top of the device to reflect the light downward. An anti-reflect (AR) coating may be added to the bottom of the device in this case. Alternatively, if the light is to be emitted out the top surface, the HR coating may be placed on the bottom of the device, and an AR coating placed on top.

Causing the light to be emitted through the bottom of the device has the advantage of allowing the heat sink to be placed on the top of the laser, closer to the locations where heat is generated, increasing efficiency of heat sinking. In such a case, the device is preferably mounted "upside down", with the reflective coating and DBRs beneath, the substrate on top, facing a fiber core for coupling, for example. This variation helps feedback in the cavity and can decrease threshold current by 50% or more.

In FIG. 12, the laser device is shown with an outcoupling aperture between the DBRs. An outcoupling grating is shown in this example. On top of this grating is located a reflective coating that directs outcoupled light down through the substrate.

Figure 13:
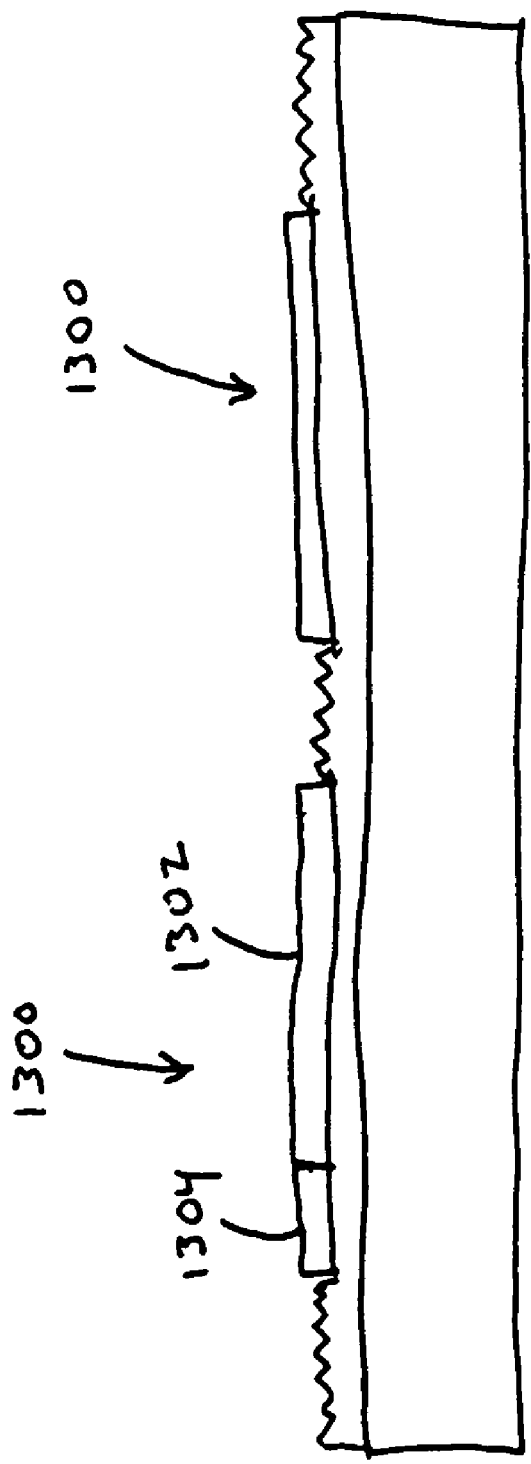
FIG. 13 shows another embodiment of the present application.

The gain region or regions of the present innovations can be modified to provide added functionality. FIG. 13 shows a DBR laser according to an embodiment of the present innovations. The gain region 1300 has multiple parts in this example, one on either side of an outcoupling grating. One part of the gain region is further split into two parts, a larger 1302 and a smaller 1304 section. The smaller part, which can be used to more sensitively adjust the current supplied to the gain region, is used for several purposes. It can be used as a fine tuning device for the wavelength of the light in the cavity. By increasing or decreasing the current, the wavelength can be slightly tuned to some degree. The smaller contact can also be used to modulate the signal generated in the cavity. By varying the supplied current over time, the intensity of the emitted light can be varied. This can be used to modulate the signal by adjusting the current over time to alter the intensity of light, and thus embed a signal in the emitted light. The smaller contact is the preferred one to use for such modulation, since it will allow faster modulation (due to lower capacitance, etc.).

Figure 14:
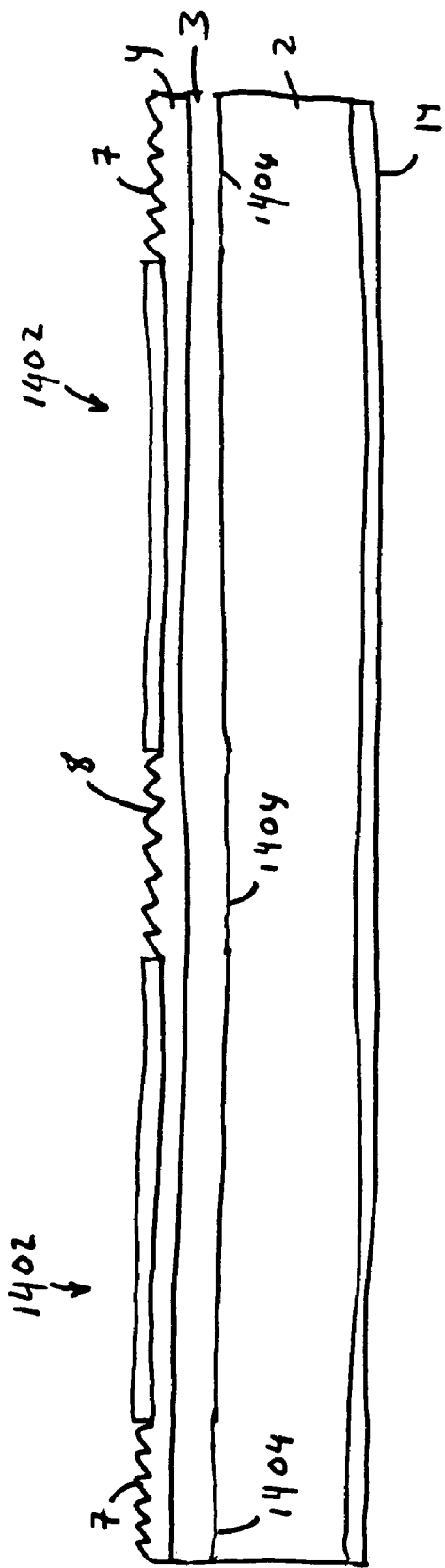
FIG. 14 shows a DBR laser with thinned quantum wells beneath the outcoupling grating and beneath the DBRs.

FIG. 14 shows a side view of a DBR laser according to another embodiment. The laser has a cavity and two reflector gratings 7, one at each end. Between the reflector gratings are the gain region 1402 and the outcoupling grating 8.

The waveguide 3 in the laser may be made from multiple layers including an active and guiding layer containing the junction between the p and n type semiconductor materials. For example, this region might comprise a sequence of one or more barrier layers alternating with quantum well layers.

In the embodiment shown in the figure, the quantum wells 1404 are made thinner beneath the reflector gratings 7 and beneath the outcoupling grating 8. This results in a less lossy, more transparent device. The larger bandgap in the thinner quantum well regions (i.e., in the unpumped regions) means less absorption of photons in the cavity because higher photon transition energy is required. This lowers internal loss, increases efficiency, and lowers the required threshold current for the device.

The quantum well thickness, by controlling the required transition energy, affects the wavelength of the photons that will lase in the cavity. This allows large scale tunability of the device during fabrication by controlling quantum well formation.

Quantum wells are fabricated at different thicknesses using selective growth of epitaxial layers. This selective growth phase of processing can also be used to simultaneously improve the performance of integrated components such as electro-absorption modulators, which benefit from quantum well structures that can be made more transparent (or have a higher photon transition energy). The integrated devices are fabricated at the same time and during the same set of processes as the lasers themselves, and selective growth can be used on them without significant process cost added.

Figure 15:
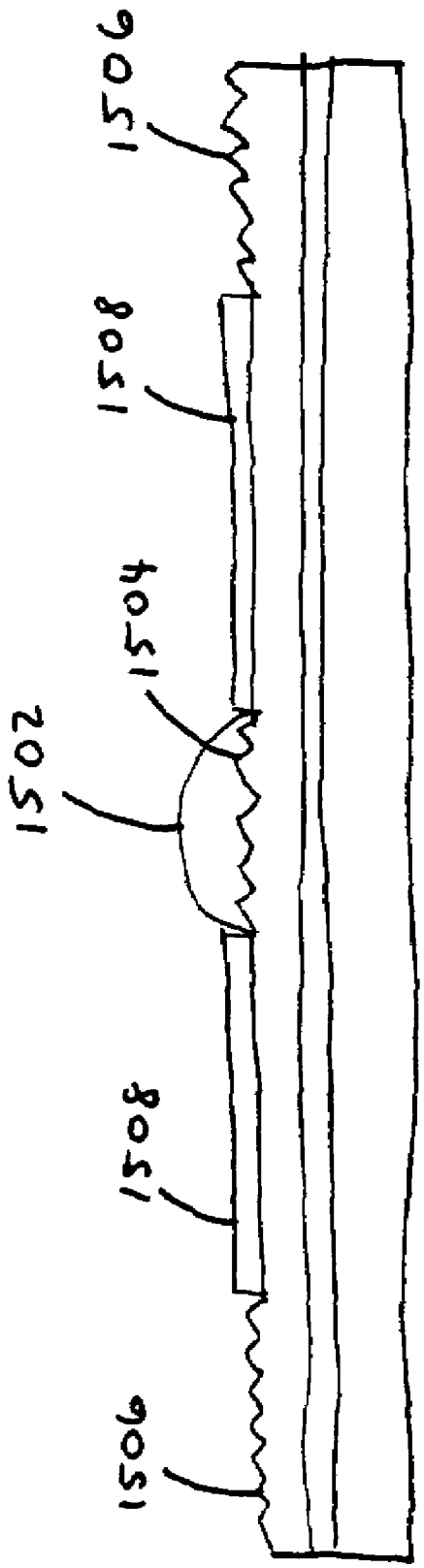
FIG. 15 shows another embodiment of the present application.

FIG. 15 shows another embodiment. In this variation, a fractional-spherical lens 1502 made of an optical polymer is formed on the outcoupling grating 1504 (by a microjet process, for example). This lens acts to make different wavelengths of light (which may exit the OCG at different angles than the normal, or from one another) converge to be coupled into a fiber mode, for example. Since the index of refraction of the material outside the lens is lower than the index of refraction of the lens, light rays passing through the lens to the lower index material will be refracted away from the normal to the surface of the lens at that point. Depending on the index difference, the refraction can be great or small. This element can be used to allow design margin in the size of the outcoupling grating. With the added lens, the outcoupling grating can be made larger, (50 microns, for example), which is useful in high power applications. Normally, an outcoupling grating of 10 micron size can outcouple light in the hundreds of milliwatt range or higher, but with larger outcoupling gratings light of higher power, well above a watt, can be outcoupled and confined to a fiber mode.

Other types of intermediate lens devices (gratings, HOEs, etc.) can also be used at this location to aid in coupling light from the outcoupling grating into a fiber core (for example). Such devices can be made on chip, or be separate devices added after processing is complete.

FIG. 15 shows a sample embodiment of the device. This embodiment comprises a DBR laser as described previously in this application, with outcoupling grating 1504 located between the two reflector gratings 1506. Gain regions 1508 are on either side of the OCG. A lens 1502 which is partly spherical in shape is formed on the outcoupling grating.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Chirped Grating: a grating whose period varies over its area;
DBR: Distributed Bragg Reflector;
DFB: Distributed Feedback (Laser);
DWDM: Dense Wavelength Division Multiplexing;
GO: Grating Outcoupled (Laser);
HOE: Holographic Optical Element;
LED: Light Emitting Diode;
LD: Laser Diode
Modulate: any controlled variation of the signal, in intensity or frequency or phase;
OCG: Outcoupling Grating;
VCSEL: Vertical Cavity Surface Emitting Laser;
Waveguide: a structure which guides the propagation of photons, usually by internal reflection.

The following background publications provide additional detail regarding possible implementations of the disclosed embodiments, and of modifications and variations thereof, and the predictable results of such modifications. All of these publications are hereby incorporated by reference: "Surface Emitting Semiconductor Lasers and Arrays," Ed. Evans and Hammer, Academic Press, 1993; "Research Toward Optical Fiber transmission Systems Part 1," Proc. IEEE, 61, 1703-1751, December 1973; "Optimized Couplers Between Junction lasers and Single Mode Fibers," Hammer, Neil, RCA laboratories, Princeton, N.J., Final Report, 31 Aug. 1981-31 Jan. 1983; "Observations and Theory of High Power Butt Coupling to $LiNbO_3$-type waveguides," Hammer and Neil, IEEE J. Quantum Electronics, QE-18, 1751-1758, October 1982; "Laser Diode End Fire Coupling into $Ti:LiNbO_3$ waveguides," Appl, Optics, 18, 2536-2537, August 1979.

Modifications and Variations As will be recognized by those skilled in the art, the innovative concepts described in the present application can be modified and varied over a tremendous range of applications, and accordingly the scope of patented subject matter is not limited by any of the specific exemplary teachings given.

The gratings used for reflectors in many embodiments mentioned in this application can vary in form. One example includes a grating that will reflect two wavelengths by use of a sampled grating—two gratings superimposed on one another, one coarser than the other. Other examples include the use of chirped gratings, blazed gratings, or variable pitch gratings.

The outcoupling element in the disclosed embodiments can be a grating as described, or a holographic optical element, a lens, or any other outcoupling device. For example, a beam splitter properly positioned can also couple light out of the cavity. Blazed gratings may also be used. Circular gratings (which produce a fanned light output) can also be used in some applications.

The waveguide structure can be of different forms, for example, a ridge waveguide or a buried heterojunction.

Note that though the examples given show lasers with two separate contacts for the gain region, one on either side of the outcoupling grating, the present innovations also contemplate lasers with only one continuous gain region located to one side of the OC grating, or continuous gain regions that yet span both sides of the OC grating.

The innovative structures can also include DFB gratings rather than DBRs to reflect cavity mode light.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A laser device comprising:
a first waveguide having separate first order reflector gratings positioned at both ends of the first waveguide, the first order reflector gratings further positioned on a first surface of the laser device;
a first outcoupling positioned between the first order reflector gratings, wherein the first outcoupling is located on the first waveguide, and wherein the first outcoupling is adapted to couple light out of the first waveguide through the first surface of the laser device;
a second waveguide having separate first order reflector gratings positioned at both ends of the second waveguide, the first order reflector gratings further positioned on the first surface of the laser device; and
a second outcoupling positioned between the first order reflector gratings, wherein the second outcoupling is located on the second waveguide, wherein the second outcoupling is adapted to couple light out of the second waveguide through the first surface of the laser device, and wherein the first waveguide and the second waveguide are positioned such that the first outcoupling and the second outcoupling overlap.

2. The laser device of claim 1 further comprising:
a plurality of additional waveguides, each of the plurality of additional waveguides having separate first order reflector gratings positioned at both ends of each of the plurality of additional waveguides, each of the first order reflector gratings further positioned on a first surface of the laser device; and
a plurality of additional outcouplings positioned between the first order reflector gratings for each of the plurality of additional waveguides, wherein the plurality of additional outcouplings are located on corresponding waveguides, wherein the plurality of additional outcouplings are adapted to couple light out of corresponding waveguides through the first surface of the laser device, and wherein each of the plurality of additional waveguides are positioned such that each outcoupling of the plurality of additional outcouplings overlaps with every other outcoupling of the plurality of additional outcouplings.

3. The laser device of claim 1 wherein the first outcoupling is a first grating, the second outcoupling is a second grating, and the first grating and the second grating have a period that is equal to an integer number of wavelengths of light in the laser device.

4. The laser device of claim 1 wherein the first outcoupling is a first grating, the second outcoupling is a second grating, and wherein the first grating and the second grating are merged into a single holographic optical element.

5. The laser device of claim 1 wherein the first outcoupling and the second outcoupling are shaped to control a profile of an outcoupled light beam.

6. The laser device of claim 1 wherein the first outcoupling is a first grating, the second outcoupling is a second grating, and wherein one of the first grating and the second grating are blazed.

7. The laser device of claim 1 wherein the first outcoupling is a first grating, the second outcoupling is a second grating, and wherein the first grating and the second grating are adapted to emit the same wavelength of light.

8. The laser device claim 1 wherein the first waveguide further comprises:
a first gain region disposed between the first order reflector gratings of the first waveguide; and
a second gain region disposed between the first order reflector gratings of the first wave guide, wherein the first outcoupling is disposed between the first gain region and the second gain region.

9. The laser device of claim 1 wherein the first gain region is tapered and the second gain region is tapered.

10. The laser device claim 8 wherein the second waveguide further comprises:
a third gain region disposed between the first order reflector gratings of the second waveguide; and
a fourth gain region disposed between the first order reflector gratings of the second waveguide, wherein the second outcoupling is disposed between the third gain region and the fourth gain region.

11. The laser device of claim 10 wherein the third gain region is tapered and the fourth gain region is tapered.

12. The laser device of claim 8 wherein the first gain region is separated into a first sub-region and a second sub-region, wherein the second sub-region is smaller than the first sub-region, and wherein the second sub-region is adapted to act as a tuning device for the wavelength of light in the laser device.

13. The laser device of claim 12 wherein the second gain region is separated into a third sub-region and a fourth sub-region, wherein the fourth sub-region is smaller than the third sub-region, and wherein the fourth sub-region is adapted to act as a tuning device for the wavelength of light in the laser device.

14. The laser device of claim 10 wherein the third gain region is separated into a fifth sub-region and a sixth sub-region, wherein the fourth gain region is separated into a seventh sub-region and an eight sub-region, wherein the sixth sub-region is smaller than the fifth sub-region, wherein the eighth sub-region is smaller than the seventh sub-region, and wherein the sixth sub-region and the eight sub-region are adapted to act as a tuning device for the wavelength of light in the laser device.

15. The laser device of claim 1 further comprising:
a first facet disposed on the first waveguide;
a second facet disposed on the first waveguide, wherein the first order reflector gratings of the first waveguide and the first outcoupling are between the first facet and the second facet;
a third facet disposed on the second waveguide; and a fourth facet disposed on the second waveguide, wherein the first order reflector gratings of the second waveguide and the second outcoupling are between the third facet and the fourth facet.

16. The laser device of claim 15 wherein the first facet, second facet, the third facet, and the fourth facet are cleaved facets.

17. The laser device of claim 15 wherein the first facet, second facet, the third facet, and the fourth facet are reflective facets.

18. The laser device of claim 1 further comprising a lens optically coupled to the first outcoupling and the second outcoupling.

19. The laser device of claim 18 wherein the lens is adapted to cause light emitted through the first outcoupling and the second outcoupling to diverge.

20. The laser device of claim 18 wherein the lens is adapted to cause light emitted through the first outcoupling and the second outcoupling to converge.

* * * * *